United States Patent
Nakamura

(10) Patent No.: US 7,189,996 B2
(45) Date of Patent: *Mar. 13, 2007

(54) ELECTRON INJECTION COMPOSITION FOR LIGHT EMITTING ELEMENT, LIGHT EMITTING ELEMENT, AND LIGHT EMITTING DEVICE

(75) Inventor: Yasuo Nakamura, Machida (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 61 days.

This patent is subject to a terminal disclaimer.

(21) Appl. No.: 11/071,229

(22) Filed: Mar. 4, 2005

(65) Prior Publication Data

US 2005/0147847 A1 Jul. 7, 2005

Related U.S. Application Data

(62) Division of application No. 10/862,318, filed on Jun. 8, 2004, now Pat. No. 6,914,269.

(30) Foreign Application Priority Data

Jun. 13, 2003 (JP) .............................. 2003-169748

(51) Int. Cl.
- H01L 29/04 (2006.01)
- H01L 29/10 (2006.01)
- H01L 31/20 (2006.01)
- H01L 31/036 (2006.01)
- H01L 31/0376 (2006.01)
- H01L 27/01 (2006.01)
- H01L 27/12 (2006.01)

(52) U.S. Cl. .......................... 257/59; 257/72; 257/350; 257/E33.013; 257/E33.02; 257/E27.014

(58) Field of Classification Search ................ 257/59, 257/72, 350, E33.013, E33.02, E27.014
See application file for complete search history.

(56) References Cited

U.S. PATENT DOCUMENTS

| | | | |
|---|---|---|---|
| 6,303,963 B1 * | 10/2001 | Ohtani et al. | ............... 257/350 |
| 6,593,450 B2 | 7/2003 | Woo et al. | |
| 6,800,722 B2 | 10/2004 | Pei | |
| 6,914,269 B2 * | 7/2005 | Nakamura | ............... 257/103 |
| 2002/0064680 A1 | 5/2002 | Spreitzer et al. | |
| 2002/0065422 A1 | 5/2002 | Kunimoto et al. | |
| 2003/0189191 A1 | 10/2003 | Kunimoto et al. | |
| 2004/0009368 A1 | 1/2004 | Otani et al. | |
| 2004/0091738 A1 | 5/2004 | Psai et al. | |
| 2004/0131881 A1 | 7/2004 | Zheng et al. | |
| 2004/0181021 A1 | 9/2004 | Uckert et al. | |
| 2004/0202892 A1 | 10/2004 | Yasuda et al. | |
| 2006/0134840 A1 * | 6/2006 | Ohtani et al. | ............... 438/150 |
| 2006/0141645 A1 * | 6/2006 | Yamazaki et al. | ............ 438/22 |

FOREIGN PATENT DOCUMENTS

| | | |
|---|---|---|
| JP | 3408154 | 3/2003 |
| JP | 3408154 | 5/2003 |

OTHER PUBLICATIONS

European Search Report dated Oct. 12, 2004 for EP 04 01 3287.
T. Akasaka et al., *Photo-Induced Energy Transfer and its Switching in Dyad and Triad Chromophore Systems Composed of Coumarin, Ru (II) and OS (II) Terpyridine-Type Complexes*, The Royal Society of Chemistry 2003, No. 8, pp. 1537-1544.
J. Collin, *Photoinduced Processes in Dyads and Triads Containing a Ruthenium (II)-Bis(Terpyridine) Photosensitizer Covalently Linked to Electron Donor and Acceptor Groups*, American Chemical Society, 1991, vol. 30, No. 22, pp. 4230-4238.
F. Barigelletti et al., *A Functionalized Ruthenium (II)-Bis-Terpyridine Complex as a Rod-Like Luminescent Sensor of Zinc (II)*, Chem. Commun., 1998, No. 21, pp. 2333-2334.
F. Barigelletti et al., *Rigid Rod-Like Dinuclear Ru(II)/OS(II) Terpyridine-Type Complexes. Electrochemical Behavior, Absorption Spectra, Luminescence Properties, and Electronic Energy Transfer Through Phenylene Bridges*, American Chemical Society, 1994, vol. 116, No. 26, pp. 7692-7699.
F. Neve et al., *Synthesis, Structure, Photophysical Properties, and Redox Behavior of Cyclometalated Complexes of Iridium (III) with Functionalized 2,2'-Bipyridines*, American Chemical Society, 1999, vol. 38, No. 10, pp. 2250-2258.
*Exhibition of Active Matrix Type Organic EL Display at 13th Flat Panel Display Manufacturing Technology Expo & Conference*, by ELDis Group dated on Jul. 2, 2003.

Documents distributed in the 13th *Flat Panel Display Manufacturing Technology Expo & Conference* by ELDis Group (Three colored pages and Two black and white pages).
*Two-Way Display Developed*, The Japan Times, Jul. 3, 2003.
*Mass Production of Organic EL Devices*, Shimotsuke Newspaper, Jul. 3, 2003.
J. Kido and T. Matsumoto, "Bright Organic Electroluminescent Devices Having a Metal-Doped Electron-Injecting Layer," Applied Physics Letters, Nov. 16, 1998, vol. 73, No. 20, pp. 2866-2868.
G. Parthasarathy et al., "High-Efficiency Transparent Organic Light-Emitting Devices," Applied Physics Letters, Apr. 10, 2000, vol. 76, No. 15, pp. 2128-2130.

\* cited by examiner

*Primary Examiner*—Ngân V. Ngô
(74) *Attorney, Agent, or Firm*—Eric J. Robinson; Robinson Intellectual Property Law Office, P.C.

(57) ABSTRACT

In the present invention, an electron injection composition for a light-emitting element, comprising a pyridine derivative represented by general formula 1 and at least one of an alkali metal, an alkali earth metal, and a transition metal, is used to form an electron injection layer in a portion of a layer including luminescent material in a light-emitting element, and it is also an object of the present invention to provide, by using the composition, a light-emitting element that has more superior characteristics and a longer lifetime as compared to conventional ones.

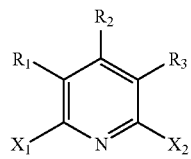

(1)

where each of $X_1$ and $X_2$ represents:

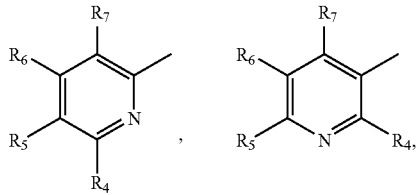

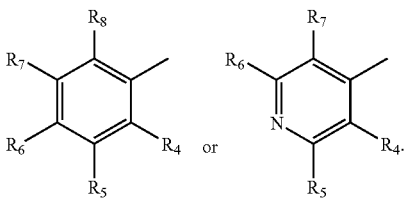

(where each of $R_1$ to $R_8$ represents hydrogen, halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsbstituted heterocyclic group.)

24 Claims, 6 Drawing Sheets

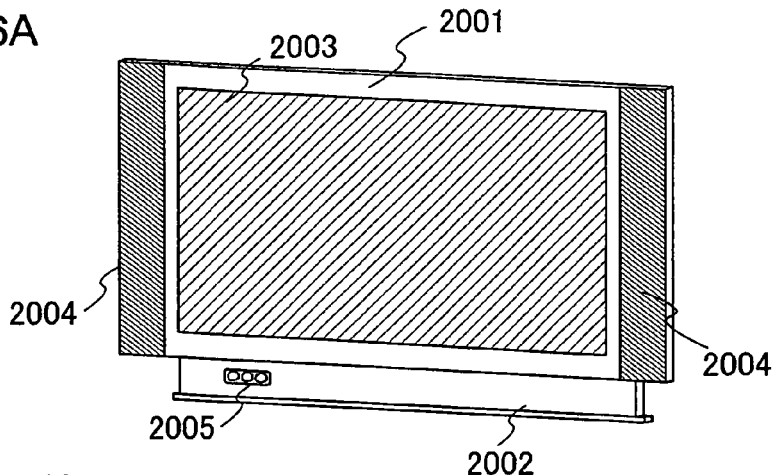
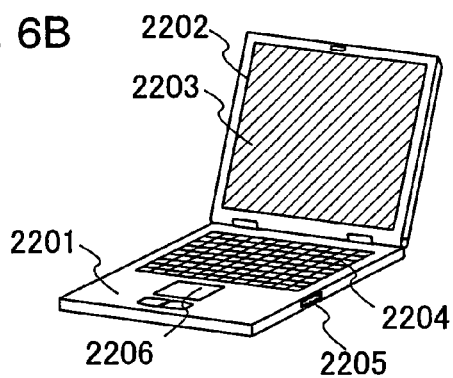
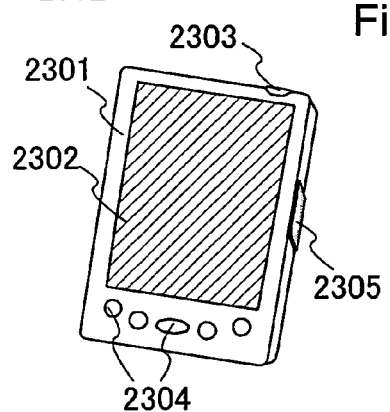
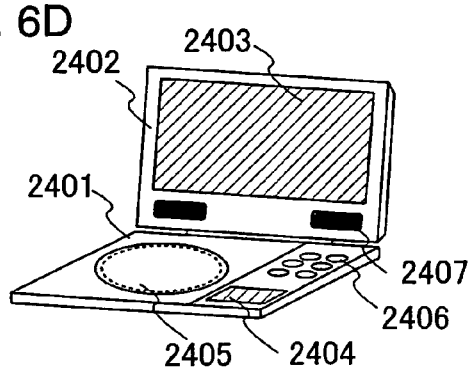
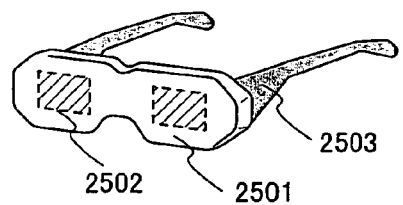
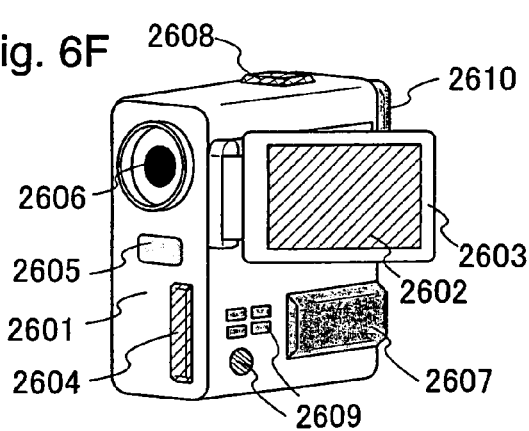
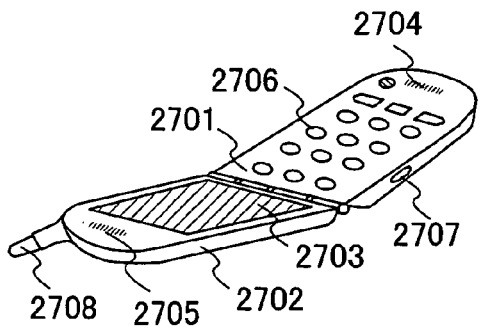

ELECTRON INJECTION COMPOSITION FOR LIGHT EMITTING ELEMENT, LIGHT EMITTING ELEMENT, AND LIGHT EMITTING DEVICE

This Application is a division of Ser. No. 10/862,318 filed Jun. 8, 2004 which is now U.S Pat. No. 6,914,269.

BACKGROUND OF THE INVENTION

1. Field of the Invention

The present invention relates to an electron injection composition for a light-emitting element, a light-emitting element formed with the use of the electron injection composition, and a light-emitting device that has the light-emitting element.

2. Description of the Related Art

A light-emitting element that uses a material as a light emitter, which has features such as a thin thickness and lightweight, a high speed response, and low DC voltage drive, has been expected to be applied to a next-generation flat panel display. In addition, it is said that a light-emitting device that has light-emitting elements arranged in a matrix shape is superior in having a wide view angle and a high level of visibility, as compared to a conventional liquid crystal display device.

A light-emitting element is said to have an emission mechanism that: an electron injected from a cathode and a hole injected from an anode are recombined in the luminescence center of a layer including luminescent material to form an excited molecule when a voltage is applied with the layer including the luminescent material between the pair of electrodes; and energy is released to emit light while the excited molecule moves back toward a ground state. As the excited state, a singlet excited state and a triplet excited state are known, and luminescence is said to be possible through any of the singlet excited state and the triplet excited state.

As for such a light-emitting element as this, there are a lot of problems depending on materials against improving characteristics of the element, and therefore, in order to overcome the problems, the structure of the element has been improved and materials for the element has been developed, for example.

One of the problems depending on materials is that there are few appropriate materials for forming a transparent conductive film. As an appropriate material for forming a transparent conductive film, a material that has a large work function (specifically a work function of 4.0 eV or more) such as ITO (indium tin oxide) or IZO (indium zinc oxide) of indium oxide mixed with zinc oxide (ZnO) at 2 to 20% is known. Since the transparent conductive film as mentioned above is used for a transparent electrode to take light from a light-emitting element to the outside, it is usually the case that the transparent electrode functions as anode of the light-emitting element.

On the contrary, it is reported that an electron injection from a transparent electrode can be improved to make the transparent electrode formed of a material that has a large work function such as ITO function as a cathode when a layer for improving an electron injection from an electrode (hereinafter, referred to as an electron injection layer) is formed in contact with the transparent electrode (refer to Non-Patent Documents 1 and 2, for example). In this case, an electron transport material (for example, tris (8-quinolinolato) aluminum (hereinafter, referred to as Alq$_3$), 2,9-dimethyl-4,7-diphenyl-1,10-phenanthroline also referred to as bathocuproin (hereinafter, referred to as BCP), and copper phthalocyanine (hereinafter, referred to as Cu—Pc)) is doped with an alkali metal to form the electron injection layer.

In addition, it is also reported that an electron injection from an electrode can be remarkably improved in the case where BCP among electron injection layers, which is known as a material that is superior in transporting only electron, is doped with Li.

However, it is difficult to keep amorphous when BCP is used to form a film, and BCP also has a defect of being easy to crystallize with time. Therefore, in the case of forming an element, deterioration in device characteristics such as fluctuations in luminance is caused due to a change in luminous efficiency, and the element also has a problem of a shortened lifetime due to deterioration in luminance.

(Non-Patent Document 1)

Junji Kido, Toshio Matsumoto, Applied Physics Letters, Vol. 73, No. 20 (16 Nov. 1998), 2866–2868

(Non-Patent Document 2)

G. Parthasarathy, C. Adachi, P. E. Burrows, S. R. Forrest, Applied Physics Letters, Vol. 76, No. 15 (10 Apr. 2000), 2128–2130

SUMMARY OF THE INVENTION

It is an object of the present invention to provide an electron injection composition for a light-emitting element, which is superior in injecting electrons and is hard to crystallize with time in the case of forming a film to include the electron injection composition, and it is also an object of the present invention to provide, by using the electron injection composition, a light-emitting element that has more superior characteristics and a longer lifetime as compared to conventional ones, and a light-emitting device that uses the light-emitting element.

The inventor has found that a pyridine derivative is a material that is superior in transporting electrons and is hard to crystallize with time in the case of forming a film to include the pyridine derivative, and that a layer that is superior in injecting electrons is formed when at least one of an alkali metal, an alkali earth metal, and a transition metal is included in the pyridine derivative. In this connection, the inventor has suggested that a pyridine derivative is used in a portion of a layer including a luminescent material in a light-emitting element that has the layer including the luminescent material between a pair of electrodes.

In other words, the present invention provides an electron injection composition for a light-emitting element, including a material represented by general formula 1 and at least one of an alkali metal, an alkali earth metal, and a transition metal, wherein a molar ratio of the material represented by general formula 1 to said one of an alkali metal, the alkali earth metal, and the transition metal is from 1:0.1 to 1:10, more preferably from 1:0.5 to 1:2.

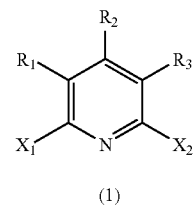

(General formula 1)

(1)

-continued where each of X1 and X2 represents:

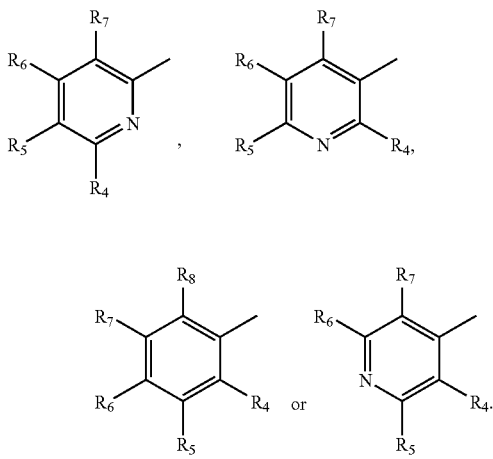

(where $X_1$ and $X_2$ have a same structure or respectively have different structures, and $R_1$ to $R_8$ individually represent hydrogen, halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocyclic group.)

Further, it is preferable that a ratio of an amount of substance of the material represented by general formula 1 to the total amount of substance of the alkali metal, the alkali earth metal, and the transiton metal is from 1:0.1 to 1:10, more preferably from 1:0.5 to 1:2.

Besides, the present invention also includes a light-emitting element including an electron injection layer formed by using the electron injection composition since the electron injection composition described above is superior in injecting electrons.

In other words, a light-emitting element comprising at least a layer including a luminescent material between a pair of electrodes, where the layer including the luminescent material comprises a layer including a material represented by the general formula 1 and at least one of an alkali metal, an alkali earth metal, and a transition metal.

In the light-emitting element, the layer includes the material represented by the general formula 1 and one of the alkali metal, the alkali earth metal, and the transition metal, wherein a molar ratio of the material represented by general formula 1 to said one of the alkali metal, the alkali earth metal, and the transition metal is from 1:0.1 to 1:10, more preferably from 1:0.5 to 1:2.

In addition, in the light-emitting element, the layer including the material represented by the general formula 1 and at least one of the alkali metal, the alkali earth metal, and the transition metal is formed in contact with one of the pair of electrodes, where the electrode is an electrode that functions as a cathode while the other is an electrode that functions as an anode. In the case where the layer functions as an electron injection layer in contact with the electrode that functions as a cathode, the electrode has a transmissivity of 70% or more to visible light.

The present invention includes the case that each of the pair of electrodes has a transmissivity of 70% or more to visible light.

Further, the present invention includes a light-emitting device that has the light-emitting element described above as a part.

BRIEF DESCRIPTION OF THE DRAWINGS

In the accompanying drawings:
FIGS. 6A to 6G are diagrams describing electronic devices.

DETAILED DESCRIPTION OF THE INVENTION

Figure 1:
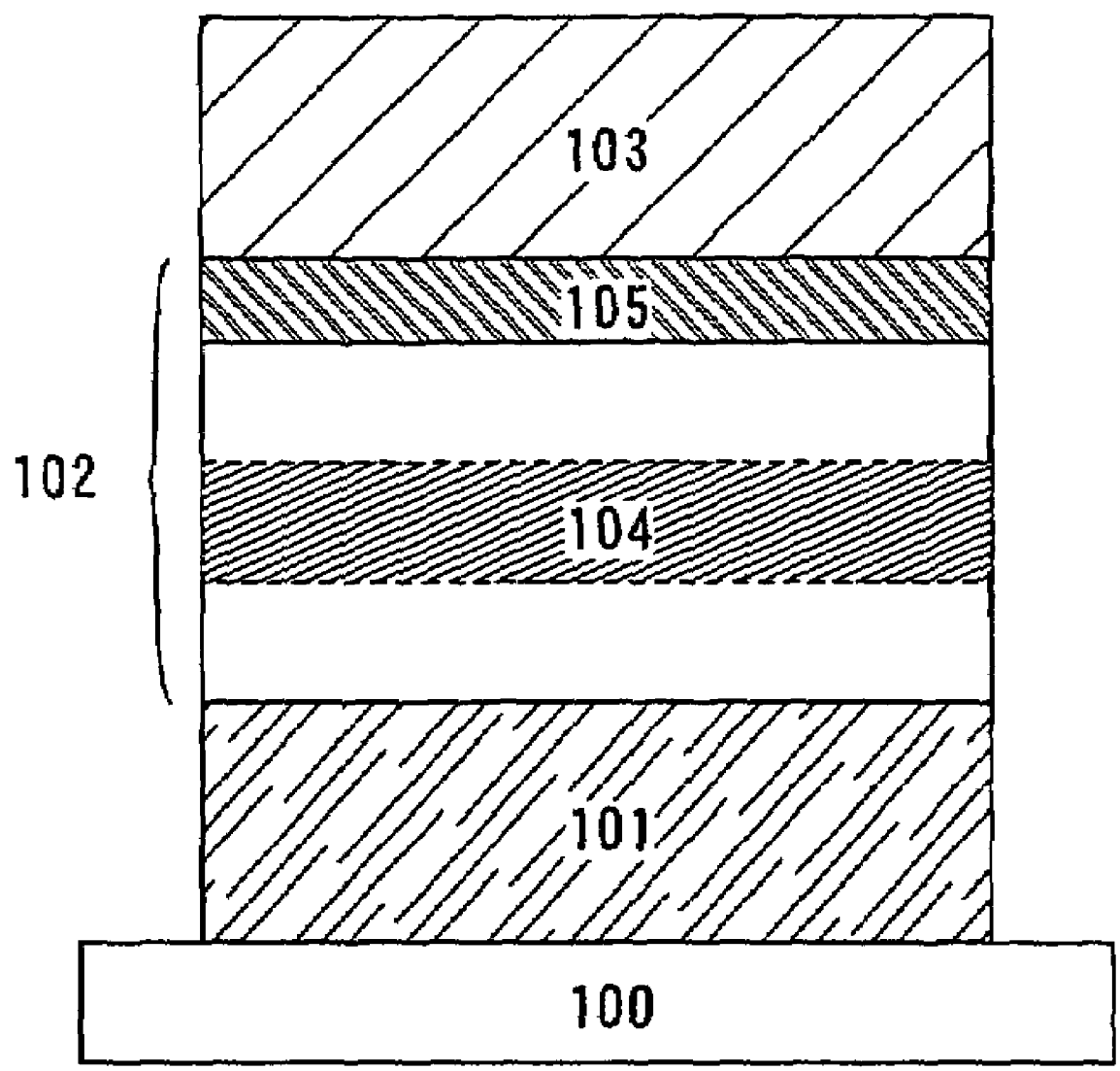
FIG. 1 is a diagram describing a light-emitting element according to the present invention.

A light-emitting element according to the present invention has a structure shown in FIG. 1. Basically, a layer 102 including a luminescent material is sandwiched between a pair of electrode (a first electrode 101 and a second electrode 103), and the layer 102 including the luminescent material has at least a light-emitting layer 104 and an electron injection layer 105 comprising an electron injection composition for a light-emitting element according to the present invention. In addition, layers such as a hole injection layer, a hole transport layer, a hole blocking layer, and an electron transport layer are appropriately combined for forming the layer 102 including the luminescent material. Here, the case where the first electrode 101 formed on a substrate 100 functions as an anode while the second electrode 103 functions as a cathode will be described.

In the present invention, the electron injection composition for a light-emitting element is formed by doping a pyridine derivative (PY) represented by the following general formula 1 with one of an alkali metal, an alkali earth metal, and a transition metal, and the electron injection layer 105 is provided in contact with the cathode of the light-emitting element.

(General formula 1)

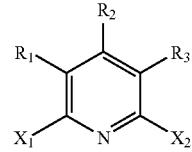

(1)

where each of X1 and X2 represents:

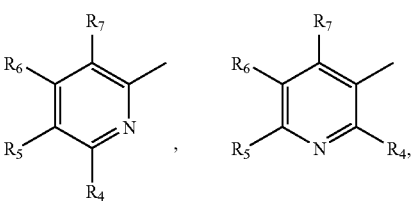

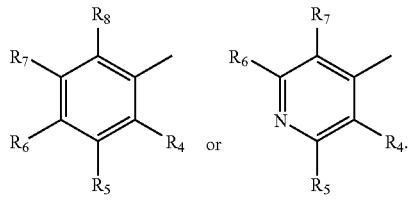

(where $X_1$ and $X_2$ have a same structure or respectively have different structures, and $R_1$ to $R_8$ individually represent hydrogen, halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocyclic group.)

The pyridine derivative (PY) represented by the general formula 1 includes specific materials shown by structure formulas 2 to 5.

(Structure formula 2)

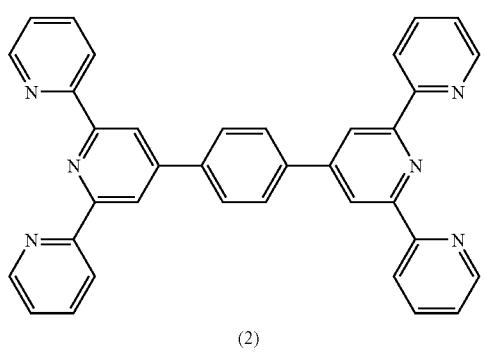

(2)

1, 4-Bis (2, 2', 6', 2''-terpyridine-4'-yl) benzene (Structure formula 3)

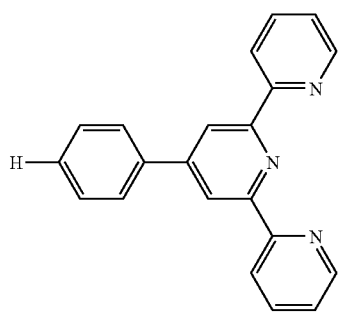

(3)

4'-(4-Tolyl)-2, 2', 6', 2''-terpyridine (Structure formula 4)

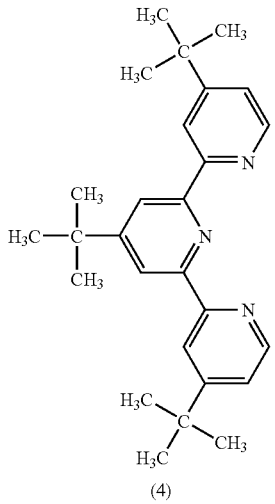

(4)

4, 4', 4'' Tri-tert-butyl-2, 2', 6', 2''terpyridine (Structure formula 5)

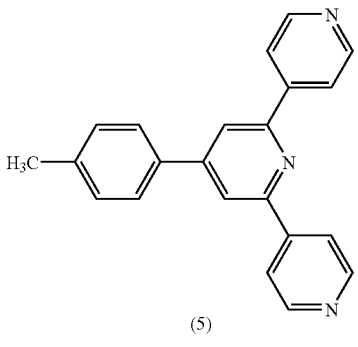

(5)

4'-(4-Tolyl)-4, 4', 6', 2''-terpyridine

As the metal (the alkali metal, the alkali earth metal, or the transition metal) included with the pyridine derivative, a metal such as Li, Na, K, Rb, Cs, Fr, Mg, Ca, Sr, Ce, or Yb is specifically used, and the molar ratio of the pyridine derivative to the metal is from 1:0.1 to 1:10, more preferably from 1:0.5 to 1:2. It is preferable that the electron injection layer 105 has a film thickness of 5 to 50 nm, more preferably 10 to 30 nm.

As an anode material that is used for the first electrode 101, it is preferable to use a metal, an alloy, an electrically conductive compound, or a mixture thereof, which has a large work function (a work function of 4.0 eV or more). As a specific example of the anode material, a metal such as gold (Au), platinum (Pt), titanium (Ti), nickel (Ni), tungsten (W), chromium (Cr), molybdenum (Mo), iron (Fe), cobalt (Co), copper (Cu), palladium (Pd), or a nitride of a metal material (TiN) can be used in addition to ITO (indium tin oxide) and IZO (indium zinc oxide) of indium oxide mixed with zinc oxide (ZnO) at 2 to 20%.

On the other hand, as a cathode material that is used for the second electrode 103, it is preferable to use a metal, an alloy, an electrically conductive compound, and a mixture of these, which have a small work function (a work function of 3.8 eV or less). As a specific example of the cathode material, a transition metal that includes a rare-earth metal can be used in addition to an element belonging to Group 1 or Group 2 of the periodic table of the element (an alkali metal such as Li or Cs, or an alkali earth element such as Mg, Ca, or Sr), an alloy (such as Mg:Ag or Al:Li) including the element, and a compound (such as LiF, CsF, or $CaF_2$) including the element, and it is also possible to further laminate a metal (including an alloy) such as Al, Ag, or ITO to form the second electrode 103.

Since the electron injection layer that is superior in injecting electrons is provided in contact with the cathode in the present invention, it is also possible to use materials that have a large work function, such as ITO and IZO mentioned above.

A thin film of the anode material and a thin film of the cathode material are formed by a method such as evaporation or sputtering to respectively form the anode and the cathode, which preferably have a film thickness of 5 to 500 mm.

In the light-emitting element according to the present invention, light generated by recombination of carriers in the layer 102 including the luminescent material is emitted from one or both of the first electrode 101 (anode) and the second electrode 103 (cathode) to the outside. In other words, the first electrode 101 is formed of a transparent material in the case where light is emitted from the first electrode 101 while the second electrode 103 is formed of a transparent material in the case where light is emitted from the second electrode 103. In the case where light is emitted from the both electrodes, each of the both electrodes is formed of a transparent material.

For the layer 102 including the luminescent material, known materials can be used, and any of a low molecular weight material and a high molecular weight can be used. The material for forming the layer 102 including the luminescent material includes not only organic compounds but also an inorganic compound included in a portion of the layer 102 including the luminescent material.

The following will describe specific materials that are used for a hole injection layer, a hole transport layer, a light-emitting layer, or an electron transport layer for forming the layer 102 including the luminescent material.

As a hole injection material for forming a hole injection layer, a porphyrin-based compound is efficient among organic compounds. For example, phthalocyanine (hereinafter, referred to as $H_2$—Pc) and copper phthalocyanine (hereinafter, referred to as Cu—Pc) can be used. In addition, a material of a conductive polymer compound subjected to chemical doping such as polyethylene dioxythiophene (hereinafter, referred to as PEDOT) doped with polystyrene sulfonate (hereinafter, referred to as PSS), can be used.

As a hole transport material for forming a hole transport layer, an aromatic amine-based compound (that is, one that has a bond of benzene ring-nitrogen) is preferably used. As materials that are used widely, for example, in addition to N,N'-bis(3-methylphenyl)-N,N'-diphenyl-[1,1'-biphenyl]-4, 4'-diamine (hereinafter, referred to as TPD), a derivative thereof such as 4,4'-bis[N-(1-naphthyl)-N-phenyl-amino]-biphenyl (hereinafter, referred to as α-NPD) and star burst aromatic amine compounds such as 4,4',4"-tris(N-carbazolyl)-triphenylamine (hereinafter, referred to as TCTA), 4,4',4"-tris(N,N-diphenyl-amino)-triphenylamine (hereinafter, referred to as TDATA), and 4,4',4"-tris[N-(3-methylphenyl)-N-phenyl-amino]-triphenylamine (hereinafter, referred to as MTDATA) are included.

As a light-emitting (luminescent) material for forming a light-emitting layer, various fluorescent materials are efficient specifically in addition to metal complexes such as tris (8-quinolinolato) aluminum (hereinafter, referred to as $Alq_3$), tris (4-methyl-8-quinolinolato) aluminum (hereinafter, referred to as $Almq_3$), bis (10-hydroxybenzo [h]-quinolinato) beryllium (herenafter, referred to as $BeBq_2$), bis (2-methyl-8-quinolinolato)-(4-hydroxy-biphenylyl)-aluminum (abbreviation: BAlq), bis [2-(2-hydroxyphenyl)-benzoxazolato] zinc (hereinafter, referred to as $Zn(BOX)_2$), and bis [2-(2-hydroxyphenyl)-benzothiazolato] zinc (hereinafter, referred to as $Zn(BTZ)_2$).

In the case of forming the light-emitting layer in combination with a guest material, triplet luminescent materials (phosphorescent materials) such as tris (2-phenylpyridine) iridium (hereinafter, referred to as $Ir(ppy)_3$) and 2,3,7,8,12, 13,17,18-octaethyl-21H,23H-porphyrin-platinum (hereinafter, referred to as PtOEP) can be used as the guest material in addition to quinacridone, diethyl quinacridone (DEQD), dimethyl quinacridone (DMQD), rubrene, perylene, cuomarin, cuomarin 545T (C545T), DPT, Co-6, PMDFB, BTX, ABTX, DCM, and DCJT.

As an electron transport material forming an electron transport layer, a metal complex that has a quinoline skeleton or a benzoquinoline skeleton, such as $Alq_3$, $Almq_3$, or $BeBq_2$, and BAlq that is a mixed ligand complex are preferred. In addition, a metal complex that has an oxazole-based ligand or a thiazole-based ligand, such as $Zn(BOX)_2$ and $Zn(BTZ)_2$, can also be used. In addition to the metal complexes, oxadiazole derivatives such as 2-(4-biphenylyl)-5-(4-tert-butylphenyl)-1,3,4-oxadiazole (hereinafter, referred to as PBD) and 1,3-bis[5-(p-tert-butylphenyl)-1,3, 4-oxadiazole-2-yl] benzene (hereinafter, referred to as OXD-7), triazole derivatives such as 3-(4-tert-butylphenyl)-4-phenyl-5-(4-biphenylyl)-1,2,4-triazole (hereinafter, referred to as TAZ) and 3-(4-tert-butylphenyl)-4-(4-ethylphenyl)-5-(4-biphenylyl)-1,2,4-triazole (hereinafter, referred to as p-EtTAZ) can be used.

As described above, the light-emitting element according to the present invention can be obtained, where a portion of the layer 102 including the luminescent material includes the electron injection layer 105 comprising the electron injection composition according to the present invention and the electron injection layer 105 is formed in contact with the cathode (the second electrode 103 in the present embodiment mode).

Hereinafter, embodiments of the present invention will be described.

(Embodiment 1)

Figure 2:
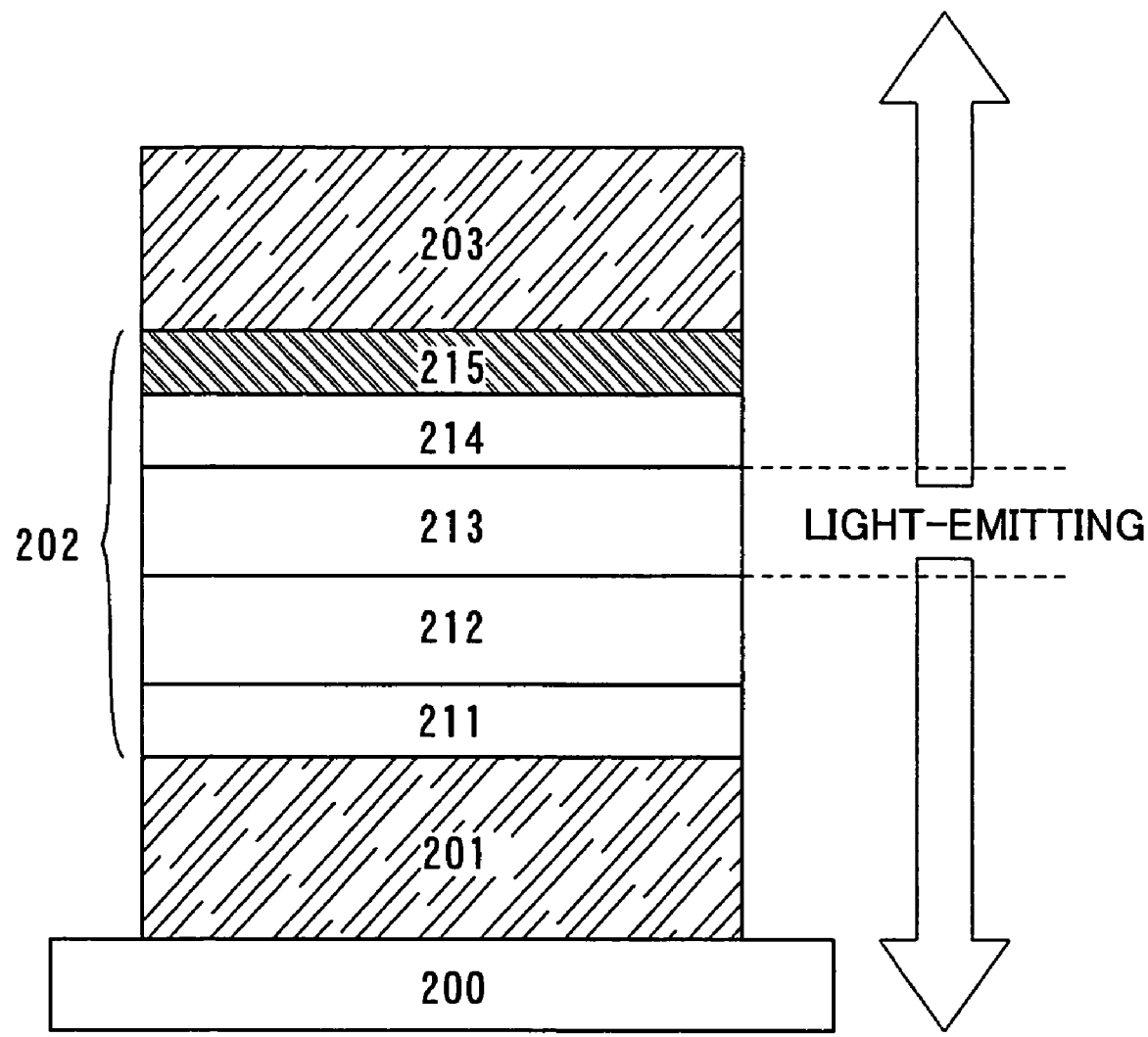
FIG. 2 is a diagram describing a light-emitting element with a both-emission structure.

In the present embodiment, a light-emitting element according to the present invention in the case of a structure in which light generated in a layer including a luminescent material is emitted from both side of first and second electrodes of a light-emitting element (hereinafter, referred to as a both-emission structure), which has an electron injection layer provided in a portion of the layer including the luminescent material, will be described with reference to FIG. 2.

First, a first electrode 201 of a light-emitting element is formed on a substrate 200. In the present embodiment, the first electrode 201 functions as an anode. ITO that is a transparent conductive film is used as a material to form the first electrode 201 with a film thickness of 110 nm by sputtering.

Next, a layer 202 including a luminescent material is formed on the first electrode (anode) 201. The layer 202 including the luminescent material in the present embodiment has a laminated structure comprising a hole injection layer 211, a hole transport layer 212, a light-emitting layer 213, an electron transport layer 214, and an electron injection layer 215.

The substrate that has the first electrode 201 formed is fixed in a substrate holder of a commercially produced vacuum deposition system with a surface of the first electrode 201 down, Cu—Pc is put in an evaporation source equipped inside the vacuum deposition system, and then the hole injection layer 211 is formed by evaporation with resistance heating to have a film thickness of 20 nm. As a material for forming the hole injection layer 211, a known hole injection material can be used.

Next, a material that is superior in transporting holes is used to form the hole transport layer 212. It is possible to use a known hole transport material as a material for forming the hole transport layer 212. In the present embodiment, α-NPD is deposited in the same way to have a film thickness of 40 nm.

Next, the light-emitting layer 213 is formed, where a hole and an electron are recombined to generate luminescence. In the present embodiment, Alq$_3$ that serves as a host material and cuomarin 545T (C545T) that serves as a guest material are used as materials for forming the light-emitting layer 213 to form the light-emitting layer 213 with a film thickness of 40 nm by co-evaporation so as to include C545T at 1 wt %.

Next, the electron transport layer 214 is formed. As a material for forming the electron transport layer 214, a known electron transport material can be used. In the present embodiment, Alq$_3$ is used to form the electron transport layer 214 with a film thickness of 20 nm by evaporation.

Next, the electron injection layer 215 is formed. An electron injection composition according to the present invention is used for the electron injection layer 215. The electron injection composition includes a pyridine derivative represented by general formula 1 and one of an alkali metal, an alkali earth metal, and a transition metal, wherein a molar ratio of the material represented by general formula 1 to said one of the alkali metal, the alkali earth metal, and the transition metal is from 1:0.1 to 1:10. In the present embodiment, the molar ratio of the pyridine derivative represented by the structure formula 2 to Li that is the alkali metal is 1:2 to form the electron injection 215 with a film thickness of 20 nm by co-evaporation.

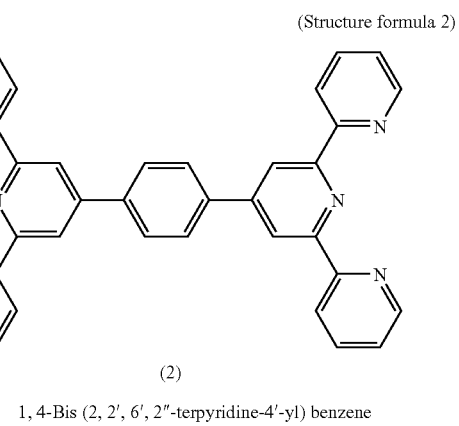

(Structure formula 2)

(2)

1, 4-Bis (2, 2', 6', 2"-terpyridine-4'-yl) benzene

After the hole injection layer 211, the hole transport layer 212, the light-emitting layer 213, the electron transport layer 214, and the electron injection later 215 are laminated to form the layer 202 including the luminescent material in this way, the second electrode 203 that functions as a cathode is formed by sputtering or evaporation.

Since the second electrode 203 is formed in contact with the electron injection layer 215 that is superior in injecting electrons, ITO (110 nm) is formed on the layer 202 including the luminescent material by sputtering in the present embodiment to obtain the second electrode 203.

As described above, the light-emitting element with a both-emission structure is formed.

Since the pyridine derivative included in the electron injection composition for a light-emitting element, which is used for the electron injection layer of the light-emitting element described in the present embodiment, is a material that is superior in injecting electrons and is hard to crystallize in the case of forming a film to include the pyridine derivative, a light-emitting element that has superior characteristics and a long lifetime can be formed.

(Embodiment 2)

Figure 3:
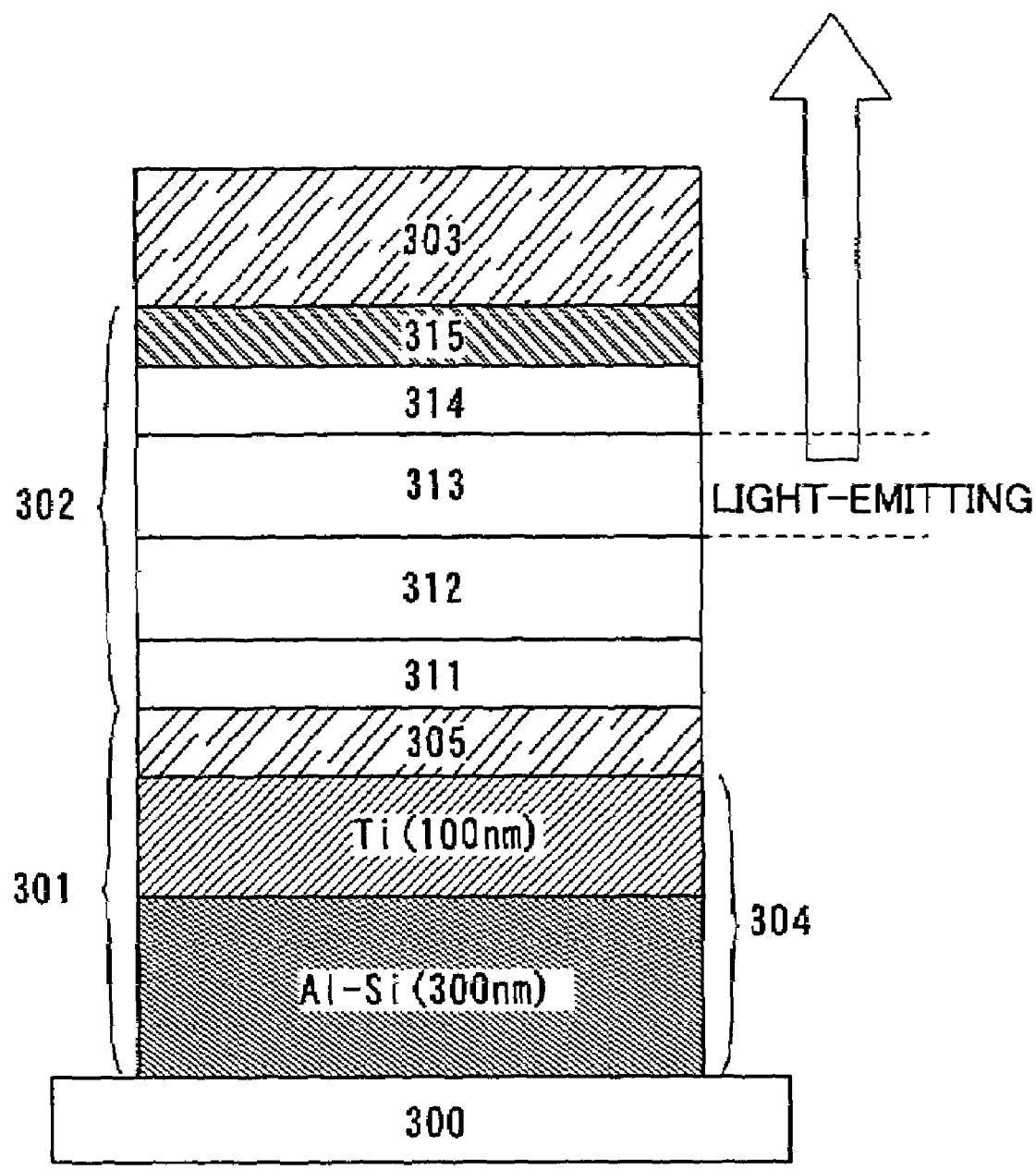
FIG. 3 is a diagram describing a light-emitting element with a top-emission structure.

In the present embodiment, a specific structure in which light is emitted from a second electrode to be formed a layer including a luminescent material (hereinafter, referred to as a top-emission structure) in the case of a structure where light generated in a layer including a luminescent material is emitted from one side of a light-emitting element will be described with reference to FIG. 3.

Only different portion from the structure in Embodiment 1 will be described here, and descriptions of component parts except a first electrode, which are the same as those of Embodiment 1, will be omitted.

A first electrode 301 in the present embodiment functions as an anode, from which no light generated in a layer 302 including a luminescent material is emitted. In other words, a nitride or carbide of an element belonging to one of Group 4, Group 5, and Group 6 of the periodic table of the elements, which has a large work function and shields light, such as titanium nitride, zirconium nitride, titanium carbide, zirconium carbide, tantalum nitride, tantalum carbide, molybdenum nitride, and molybdenum carbide, can be used as a material for forming the first electrode 301. In addition, a transparent conductive film that has a large work function and a conductive film (a reflective film) that is reflective (including also the case of shielding light) can be laminated to form the first electrode 301.

The present embodiment will describe the case where a reflective conductive film and a transparent conductive film that has a large work function are laminated to form the first electrode 301.

Specifically, a reflective conductive film 304 is formed by laminating a Ti film to be a film thickness of 100 nm after forming an Al—Si film on a substrate 300 to be a film thickness of 300 nm, and ITO is formed thereon to be 20 nm as a transparent conductive film 305.

After forming the first electrode 301, a hole injection layer 311, a hole transport layer 312, a light-emitting layer 313, an electron transport layer 314, an electron injection layer 315, and a second electrode 303 are sequentially laminated in the same way as Embodiment 1.

In this way, the light-emitting element that has the top-emission structure in which light is emitted from only the second electrode can be formed.

As mentioned in Embodiment 1, since the pyridine derivative included in the electron injection composition for a light-emitting element, which is used for the electron injection layer of the light-emitting element also in the case of the present embodiment, is a material that is superior in injecting electrons and is hard to crystallize in the case of forming a film to include the pyridine derivative, a light-emitting element that has superior characteristics and a long lifetime can be formed.

(Embodiment 3)

Figure 4:
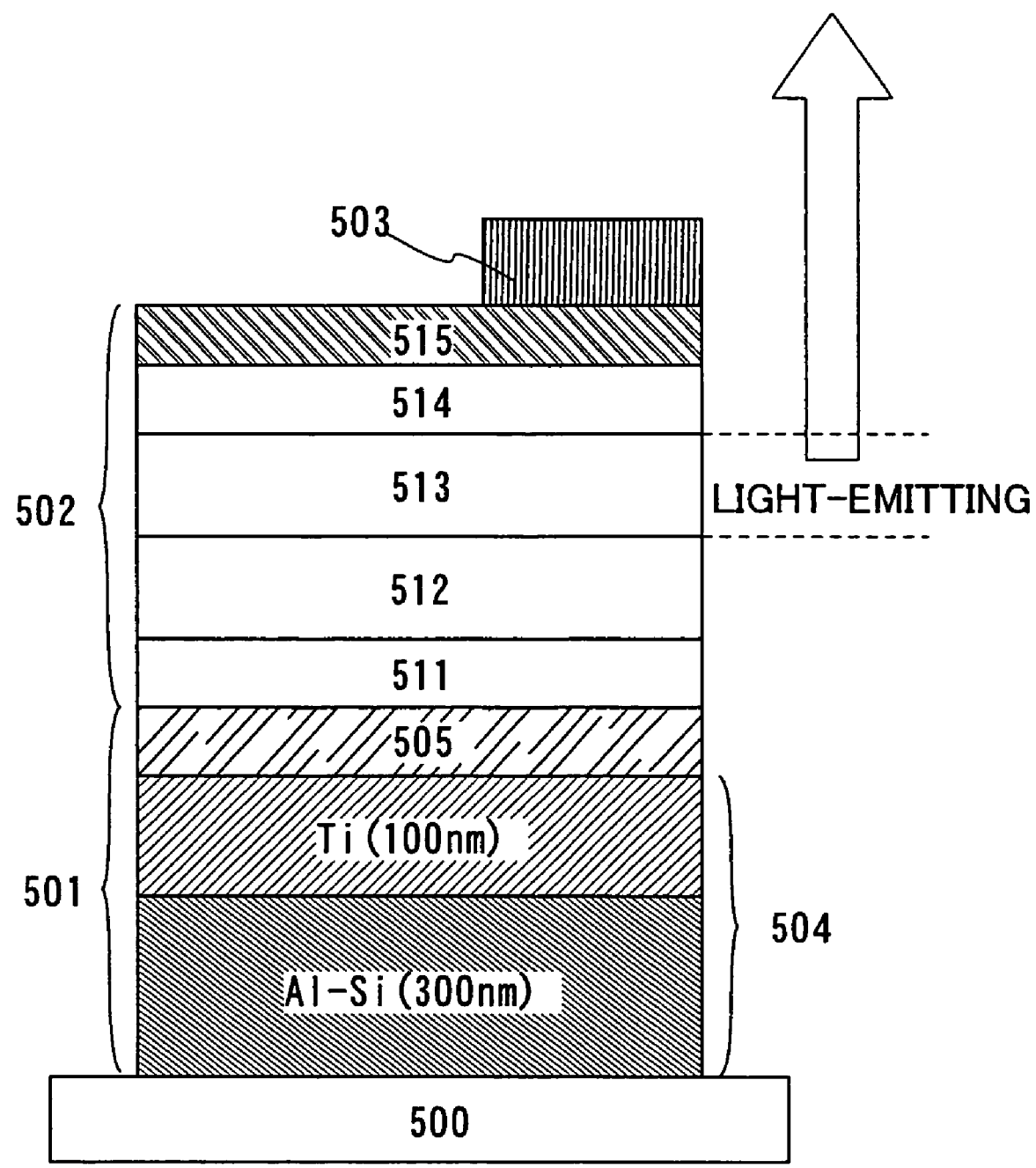
FIG. 4 is a diagram describing a light-emitting element with a top-emission structure.

In the present invention, a structure in which light is emitted from a side of an electron injection layer 515 included in a layer 502 including a luminescent material as shown in FIG. 4 (hereinafter, referred to as a top-emission structure) can also be employed in the case of a structure where light generated in a layer including a luminescent material is emitted from one side of a light-emitting element as described in Embodiment 2.

In the same way as Embodiment 2, as a first electrode 501, a reflective conductive film 504 is formed on a substrate 500 and then, a transparent conductive film 505 is formed thereon. After forming the first electrode 501, a hole injection layer 511, a hole transport layer 512, a light-emitting layer 513, an electron transport layer 514, the electron injection layer 515, and a second electrode 503 are sequentially laminated in the same way as Embodiments 1 and 2.

In the case of the present embodiment, since the second electrode (cathode) 503 that functions as an auxiliary electrode on a portion of the layer 502 including the luminescent material, light generated in the layer 502 including the luminescent material is emitted from the other portion on which the second electrode 503 is not formed. In the present embodiment, it is not always necessary to use a transparent material as a material that is used for the second electrode 503 as long as a cathode material that has a small work function, a material that shields light may be used.

(Embodiment 4)

Figure 5A:
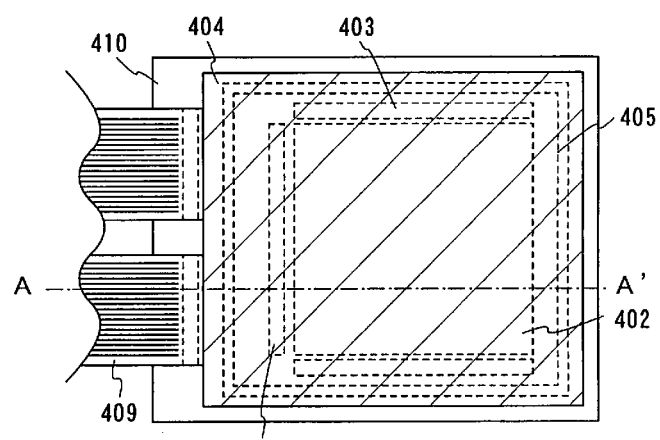
FIGS. 5A and 5B are diagrams describing a light-emitting device.
Figure 5B:
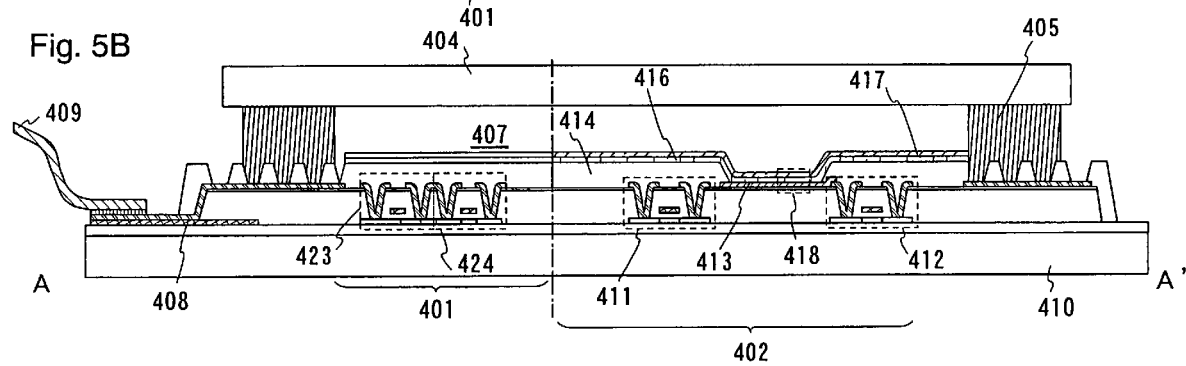

In the present embodiment, a light-emitting device that has a light-emitting element according to the present invention in a pixel portion will be described with reference to FIGS. 5A and 5B. FIG. 5A is a top view showing the light-emitting device and FIG. 5B is a sectional view of FIG. 5A cut along A–A'. Reference numeral 401 indicated by a dotted line denotes a driver circuit portion (a source side driver circuit), 402 is a pixel portion, and 403 is a driver circuit portion (a gate side driver circuit). In addition, reference numerals 404 and 405 denote a sealing substrate and a sealing agent, respectively. The inside surrounded by the sealing agent 405 is a space 407.

A wiring 408 is provided for transmitting signals to be input to the source side driver circuit 401 and the gate side driver circuit 403, and receives signals such as a video signal, a clock signal, a start signal, and a reset signal, from FPC (Flexible Printed Circuit) 409 that serves as an external input terminal. Though only the FPC is shown in the figure here, a printed wiring board (PWB) may be attached to the FPC. The light-emitting device in the specification includes not only a light-emitting device body but also a state where an FPC or a PWB is attached thereto.

Next, the sectional structure will be explained with reference to FIG. 5B. The driver circuits and the pixel portion are formed over a device substrate 410. Here, the source side driver circuit 401 as the driver circuit portion and the pixel portion 402 are shown.

In the source side driver circuit 401, a CMOS circuit is formed of a combination of an n-channel TFT 423 and a p-channel TFT 424. The TFTs forming the driver circuit may be formed of a known CMOS circuit, PMOS circuit, or NMOS circuit. Although the present embodiment shows a driver integrated type in which a driver circuit is formed over a substrate, which is not always necessary, the driver circuit can be formed not over the substrate but at the outside thereof.

The pixel portion 402 is formed of a plurality of pixels, each including a switching TFT 411, a current controlling TFT 412, and a first electrode 413 connected to a drain of the controlling TFT 412 electrically. In addition, an insulator 414 is formed to cover an edge of the first electrode 413. Here, a positive photosensitive acrylic resin film is used to form the insulator 414.

On the first electrode 413, a layer 416 including a luminescent material and a second electrode 417 are respectively formed. Here, as a material that is used for the first electrode 413 functioning as an anode, it is preferable to use a material that has a large work function. For example, in addition to single layers such as an ITO (indium tin oxide) film, an indium zinc oxide (IZO) film, a titanium nitride film, a chromium film, a tungsten film, a Zn film, and a Pt film, structures such as a laminate of a titanium nitride film and a film including aluminum as its main component and a three-layer structure of a titanium nitride film, a film including aluminum as its main component, and a titanium nitride film, can be used. When a laminated structure is employed, the wiring has a low resistance, favorable ohmic contact can be taken, and it is possible to function as an anode.

The layer 416 including the luminescent material is formed by evaporation that uses an evaporation mask or by inkjet. The layer 416 including the luminescent material includes an electron injection layer comprising an electron injection composition for a light-emitting element according to the present invention. In addition, a light-emitting layer, a hole injection layer, a hole transport layer, and an electron transport layer are included in the layer 416 including the luminescent material. In forming these layers, a low molecular weight material, a middle molecular weight material (including an oligomer and a dendrimer) and a high molecular weight material can be used. In addition, it is often the case that an organic compound is used for a single layer or a laminate in the case of forming the layer including the luminescent material. However, the present invention includes a structure in which an inorganic compound is used for a part of a film comprising an organic compound.

As a material that is used for the second electrode (cathode) 417 formed on the layer 416 including the luminescent material, ITO that is a transparent conductive film is used.

Further, the sealing substrate 404 and the substrate 410 are bonded with the sealing agent 405 to obtain a structure where a light-emitting element 418 is equipped in the space 407 surrounded by the substrate 410, the sealing substrate 404, and the sealing agent 405. The space 407 also includes a structure of filling with the sealing agent 405 in addition to a case of filling with inert gas (such as nitrogen or argon).

It is preferable to use epoxy resin for the sealing agent 405. In addition, it is desirable to use a material that allows no permeation of moisture or oxygen to as much as possible. Further, as a material that is used for the sealing substrate 404, a plastic substrate comprising FRP (Fiberglass-Reinforced Plastics), PVF (polyvinylfluoride), Mylar, polyester, or acrylic can be used besides a glass substrate and a quarts substrate.

In this way, the light-emitting device that has the light-emitting element formed according to the present invention can be obtained.

The light-emitting device shown in the present embodiment can be used freely in combination with any of the structures of the light-emitting elements shown in Embodiments 1 to 3.

(Embodiment 5)

In the present embodiment, various electronic devices completed including a light-emitting device, for example formed according to Embodiment 4 will be described.

As electronic devices manufactured with the use of a light-emitting device according to the present invention, devices such as a video camera, a digital camera, a goggle-type display (head mount display), a navigation system, a sound reproduction device (such as an in-car audio system or an audio set), a laptop personal computer, a game machine, a personal digital assistance (such as a mobile computer, a cellular phone, a portable game machine, or an electronic book), an image reproduction device equipped with a recording medium (specifically, a device equipped with a display device that can reproduce a recording medium such as a digital versatile disc (DVD) and display the image) can be given. FIGS. 6A to 6G show specific examples of such electronic devices.

FIG. 6A is a display device, which includes a frame body 2001, a support 2002, a display portion 2003, a speaker portion 2004, and a video input terminal 2005. A light-emitting device formed according to the present invention is used for the display portion 2003 to manufacture the display device. The display device includes all devices for displaying information such as for a personal computer, for receiving TV broad casting, and for displaying an advertisement.

FIG. 6B is a laptop personal computer, which includes a main body 2201, a frame body 2202, a display portion 2203, a keyboard 2204, an external connection port 2205, and a pointing mouse 2206. A light-emitting device formed according to the present invention is used for the display portion 2203 to manufacture the laptop personal computer.

FIG. 6C is a mobile computer, which includes a main body 2301, a display portion 2302, a switch 2303, an operation key 2304, and an infrared port 2305. A light-emitting device formed according to the present invention is used for the display portion 2302 to manufacture the mobile computer.

FIG. 6D is a portable image reproduction device equipped with a recording medium (specifically, a DVD reproduction device), which includes a main body 2401, a frame body 2402, a display portion A 2403, a display portion B 2404, a recording medium (such as DVD) reading portion 2405, an operation key 2406, and a speaker portion 2407. The display portion A 2403 is used mainly for displaying image information while the display portion B 2404 is used mainly for displaying character information, and a light-emitting device formed according to the present invention is used for these display portion A 2403 and display portion B 2404 to manufacture the portable image reproduction device equipped with the recording medium. The image reproduction device equipped with the recording medium further includes a home game machine.

FIG. 6E is a goggle-type display (head mount display), which includes a main body 2501, a display portion 2502, and an arm portion 2503. A light-emitting device formed according to the present invention is used for the display portion 2502 to manufacture the goggle-type display.

FIG. 6F is a video camera, which includes a main body 2601, a display portion 2602, a frame body 2603, an external connection port 2604, a remote control receiving portion 2605, an image receiving portion 2606, a battery 2607, a sound input portion 2608, an operation key 2609, and an eye piece 2610. A light-emitting device formed according to the present invention is used for the display portion 2602 to manufacture the video camera.

FIG. 6G is a cellular phone, which includes a main body 2701, a frame body 2702, a display portion 2703, a voice input portion 2704, a voice output portion 2705, an operation key 2706, an external connection port 2707, and an antenna 2708. A light-emitting device formed according to the present invention is used for the display portion 2703 to manufacture the cellular phone.

As described above, a light-emitting device formed according to the present invention is quite widely applied. In addition, since a light-emitting element included in the light-emitting device has an electron injection layer for enhancing an electron injection from an electrode in a portion of a layer including a luminescent material and a material that is hard to crystallize is used to form the electron injection layer, the light-emitting element has a low driving voltage and a long lifetime. Therefore, it is possible to reduce power consumption and extend a lifetime by applying this light-emitting device to electronic devices in all fields.

In the present invention, an electron injection from an electrode that functions as a cathode can be enhanced by forming an electron injection layer with the use of an electron injection composition for a light-emitting element, which includes a pyridine derivative and at least one of an alkali metal, an alkali earth metal, and a transition metal. Further, since the pyridine derivative is hard to crystallize in the case of forming a film to include the pyridine derivative, it is possible to provide a light-emitting element that has more superior characteristics and a longer lifetime as compared to conventional ones, and a light-emitting device that uses the light-emitting element.

Although the present invention has been fully described by way of example with reference to the accompanying drawings, it is to be understood that various changes and modifications will be apparent to those skilled in the art. Such changes and modifications should be construed as being included in the scope of the attached claims.

What is claimed is:

1. An electronic device comprising:
a thin film transistor over the substrate; and
a light emitting element electrically connected to the thin film transistor,
wherein the light emitting element further comprising a first electrode, a light emitting layer, an electron injection layer, and a second electrode,
wherein the electron injection layer comprises a layer including a material represented by general formula 1 and at least one of an alkali metal, an alkali earth metal, and a transition metal, (General formula 1)

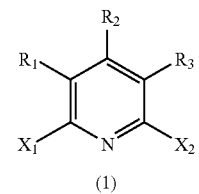

(1)

wherein each of $X_1$ and $X_2$ represents:

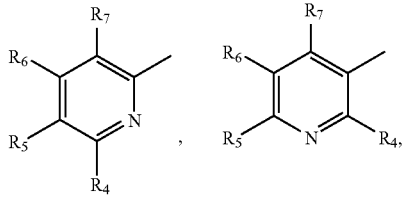

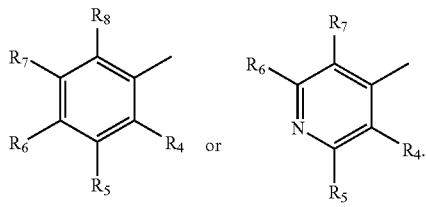

wherein $R_1$ to $R_8$ represents hydrogen, halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocyclic group.

2. An electronic device comprising:
a thin film transistor over the substrate; and
a light emitting element electrically connected to the thin film transistor,
wherein the light emitting element further comprising a first electrode, a light emitting layer, an electron injection layer, and a second electrode,
wherein the second electrode is transparent to visible light,
wherein the electron injection layer comprises a layer including a material represented by general formula 1 and at least one of an alkali metal, an alkali earth metal, and a transition metal,

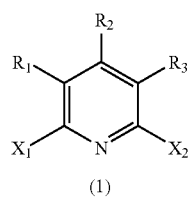

(General formula 1)

wherein each of $X_1$ and $X_2$ represents:

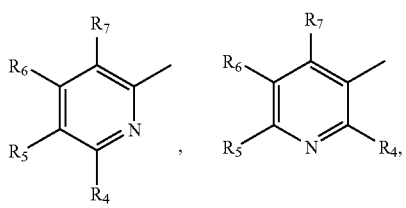

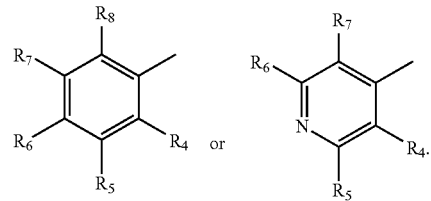

wherein $R_1$ to $R_8$ represents hydrogen, halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocyclic group.

3. An electronic device comprising:
a thin film transistor over the substrate; and
a light emitting element electrically connected to the thin film transistor,
wherein the light emitting element further comprising a first electrode, a light emitting layer, an electron injection layer, and a second electrode,
wherein the first electrode and the second electrode is transparent to visible light,
wherein the electron injection layer comprises a layer including a material represented by general formula 1 and at least one of an alkali metal, an alkali earth metal, and a transition metal,

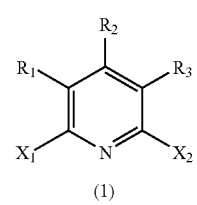

(General formula 1)

wherein each of $X_1$ and $X_2$ represents:

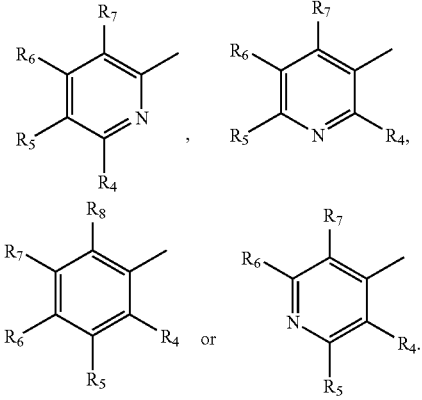

wherein $R_1$ to $R_8$ represents hydrogen, halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocyclic group.

4. An electronic device comprising:
a thin film transistor over the substrate; and
a light emitting element electrically connected to the thin film transistor,
wherein the light emitting element further comprising:
a first electrode;
a light emitting layer over the first electrode;
an electron injection layer over the light emitting layer; and
a second electrode over the electron injection layer,
wherein the electron injection layer comprises a layer including a material represented by general formula 1 and at least one of an alkali metal, an alkali earth metal, and a transition metal,

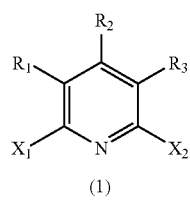

(General formula 1)

(1)

wherein each of $X_1$ and $X_2$ represents:

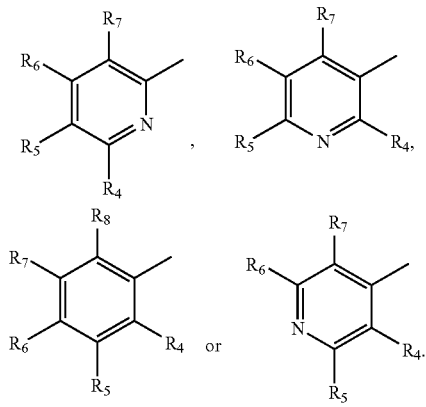

wherein $R_1$ to $R_8$ represents hydrogen, halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocyclic group.

5. An electronic device comprising:
a thin film transistor over the substrate; and
a light emitting element electrically connected to the thin film transistor,
wherein the light emitting element further comprising:
a first electrode;
a light emitting layer over the first electrode;
an electron injection layer over the light emitting layer; and
a second electrode over the electron injection layer,
wherein the second electrode is transparent to visible light,
wherein the electron injection layer comprises a layer including a material represented by general formula 1 and at least one of an alkali metal, an alkali earth metal, and a transition metal,

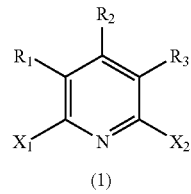

(General formula 1)

(1)

wherein each of $X_1$ and $X_2$ represents:

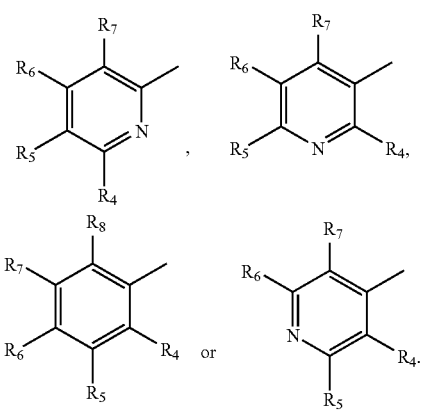

wherein $R_1$ to $R_8$ represents hydrogen, halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocyclic group.

6. An electronic device comprising:
a thin film transistor over the substrate; and
a light emitting element electrically connected to the thin film transistor,
wherein the light emitting element further comprising:
a first electrode;
a light emitting layer over the first electrode;
an electron injection layer over the light emitting layer; and
a second electrode over the electron injection layer,
wherein the first electrode and the second electrode is transparent to visible light,
wherein the electron injection layer comprises a layer including a material represented by general formula 1 and at least one of an alkali metal, an alkali earth metal, and a transition metal,

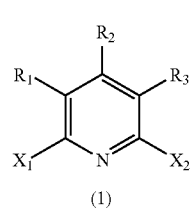

(General formula 1)

(1)

wherein each of $X_1$ and $X_2$ represents:

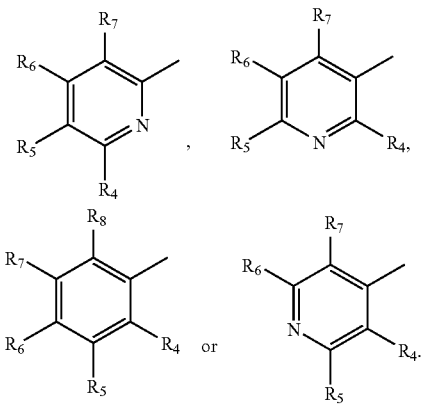

wherein $R_1$ to $R_8$ represents hydrogen, halogen, a cyano group, an alkyl group having 1 to 10 carbon atoms, a haloalkyl group having 1 to 10 carbon atoms, an alkoxyl group having 1 to 10 carbon atoms, a substituted or unsubstituted aryl group, or a substituted or unsubstituted heterocyclic group.

7. The electronic device according to claim 1,
wherein the first electrode comprises a material selected from the group consisting of a nitride of an element belonging to one of Group 4, Group 5, and Group 6 in the periodic table of the elements, a carbide of an element belonging to one of Group 4, Group 5, and Group 6 in the periodic table of the elements, gold, platinum, titanium, nickel, tungsten, chromium, molybdenum, iron, cobalt, copper, palladium.

8. The electronic device according to claim 1,
wherein the first electrode comprises a material selected from the group consisting of indium tin oxide and indium zinc oxide.

9. The electronic device according to claim 1,
wherein the second electrode comprises a material selected from the group consisting of indium tin oxide and indium zinc oxide.

10. The electronic device according to claim 2,
wherein the first electrode comprises a material selected from the group consisting of a nitride of an element belonging to one of Group 4, Group 5, and Group 6 in the periodic table of the elements, a carbide of an element belonging to one of Group 4, Group 5, and Group 6 in the periodic table of the elements, gold, platinum, titanium, nickel, tungsten, chromium, molybdenum, iron, cobalt, copper, palladium.

11. The electronic device according to claim 2,
wherein the second electrode comprises a material selected from the group consisting of indium tin oxide and indium zinc oxide.

12. The electronic device according to claim 3,
wherein the first electrode and the second electrode comprises a material selected from the group consisting of indium tin oxide and indium zinc oxide.

13. The electronic device according to claim 4,
wherein the first electrode comprises a material selected from the group consisting of a nitride of an element belonging to one of Group 4, Group 5, and Group 6 in the periodic table of the elements, a carbide of an element belonging to one of Group 4, Group 5, and Group 6 in the periodic table of the elements, gold, platinum, titanium, nickel, tungsten, chromium, molybdenum, iron, cobalt, copper, palladium.

14. The electronic device according to claim 4,
wherein the first electrode comprises a material selected from the group consisting of indium tin oxide and indium zinc oxide.

15. The electronic device according to claim 4,
wherein the second electrode comprises a material selected from the group consisting of indium tin oxide and indium zinc oxide.

16. The electronic device according to claim 5,
wherein the first electrode comprises a material selected from the group consisting of a nitride of an element belonging to one of Group 4, Group 5, and Group 6 in the periodic table of the elements, a carbide of an element belonging to one of Group 4, Group 5, and Group 6 in the periodic table of the elements, gold, platinum, titanium, nickel, tungsten, chromium, molybdenum, iron, cobalt, copper, palladium.

17. The electronic device according to claim 5,
wherein the second electrode comprises a material selected from the group consisting of indium tin oxide and indium zinc oxide.

18. The electronic device according to claim 6,
wherein the first electrode and the second electrode comprises a material selected from the group consisting of indium tin oxide and indium zinc oxide.

19. The electronic device according to claim 1, wherein the electronic device is selected from the group consisting of a video camera, a digital camera, a goggle-type display, a navigation system, a sound reproduction device, a laptop personal computer, a game machine, a personal digital assistance, a cellular phone, a portable game machine, an electronic book, and an image reproduction device.

20. The electronic device according to claim 2, wherein the electronic device is selected from the group consisting of a video camera, a digital camera, a goggle-type display, a navigation system, a sound reproduction device, a laptop personal computer, a game machine, a personal digital assistance, a cellular phone, a portable game machine, an electronic book, and an image reproduction device.

21. The electronic device according to claim 3, wherein the electronic device is selected from the group consisting of a video camera, a digital camera, a goggle-type display, a navigation system, a sound reproduction device, a laptop personal computer, a game machine, a personal digital assistance, a cellular phone, a portable game machine, an electronic book, and an image reproduction device.

22. The electronic device according to claim 4, wherein the electronic device is selected from the group consisting of a video camera, a digital camera, a goggle-type display, a navigation system, a sound reproduction device, a laptop personal computer, a game machine, a personal digital assistance, a cellular phone, a portable game machine, an electronic book, and an image reproduction device.

23. The electronic device according to claim 5, wherein the electronic device is selected from the group consisting of a video camera, a digital camera, a goggle-type display, a navigation system, a sound reproduction device, a laptop personal computer, a game machine, a personal digital assistance, a cellular phone, a portable game machine, an electronic book, and an image reproduction device.

24. The electronic device according to claim 6, wherein the electronic device is selected from the group consisting of a video camera, a digital camera, a goggle-type display, a navigation system, a sound reproduction device, a laptop personal computer, a game machine, a personal digital assistance, a cellular phone, a portable game machine, an electronic book, and an image reproduction device.

* * * * *